(12) United States Patent
Tong et al.

(10) Patent No.: US 9,225,345 B2
(45) Date of Patent: Dec. 29, 2015

(54) CHARGE PUMP CALIBRATION FOR DUAL-PATH PHASE-LOCKED LOOP

(71) Applicant: SILICON IMAGE, INC., Sunnyvale, CA (US)

(72) Inventors: Baoli Tong, Shanghai (CN); Fei Song, Shanghai (CN); Xiaozhi Lin, Shanghai (CN); Xiaofeng Wang, Shanghai (CN)

(73) Assignee: Lattice Semiconductor Corporation, Portland, OR (US)

( * ) Notice: Subject to any disclaimer, the term of this patent is extended or adjusted under 35 U.S.C. 154(b) by 14 days.

(21) Appl. No.: 14/371,973

(22) PCT Filed: Jan. 30, 2014

(86) PCT No.: PCT/CN2014/071848
§ 371 (c)(1),
(2) Date: Jul. 11, 2014

(87) PCT Pub. No.: WO2015/113308
PCT Pub. Date: Aug. 6, 2015

(65) Prior Publication Data
US 2015/0214966 A1 Jul. 30, 2015

(51) Int. Cl.
*H03L 7/06* (2006.01)
*H03L 7/089* (2006.01)
*H03L 7/099* (2006.01)

(52) U.S. Cl.
CPC ............ *H03L 7/0898* (2013.01); *H03L 7/0893* (2013.01); *H03L 7/0992* (2013.01); *H03L 7/0994* (2013.01)

(58) Field of Classification Search
CPC ....... H03L 7/0895; H03L 7/0896; H03L 7/18; H03L 7/0891; H03L 7/0893

USPC .................................................. 327/156–158
See application file for complete search history.

(56) References Cited

U.S. PATENT DOCUMENTS

| | | | |
|---|---|---|---|
| 7,049,866 B2 * | 5/2006 | Wilson | H03L 7/0891 |
| | | | 327/157 |
| 7,907,022 B2 * | 3/2011 | Thakur | H03L 7/0898 |
| | | | 331/16 |

(Continued)

FOREIGN PATENT DOCUMENTS

| | | |
|---|---|---|
| CN | 101079632 A | 11/2007 |
| CN | 101505150 A | 8/2009 |

OTHER PUBLICATIONS

PCT International Search Report and Written Opinion, PCT Application No. PCT/CN2014/071848, Nov. 13, 2014, 8 pages.

*Primary Examiner* — Diana J Cheng
(74) *Attorney, Agent, or Firm* — Fenwick & West LLP

(57) ABSTRACT

Embodiments of the invention are generally directed to charge pump calibration for a dual-path phase-locked loop circuit. An embodiment of an apparatus includes a phase frequency detector; an integral path including a first charge pump; a proportional path including a second charge pump; and a calibration mechanism for the first charge pump and the second charge pump, the calibration mechanism including a phase detector to detect whether a reference clock signal or a feedback clock signal is leading or lagging in phase and to generate a signal indicating which clock signal is leading or lagging, a first memory element and a second memory element to store the signal from the phase detector, a first control logic to adjust current for the first charge pump based on the value stored in the first memory element, and a second control logic to adjust current for the second charge pump based on the value stored in the second memory element.

24 Claims, 10 Drawing Sheets

(56) References Cited

U.S. PATENT DOCUMENTS

| | | | |
|---|---|---|---|
| 8,901,994 B2 * | 12/2014 | Fan | H03H 19/004 327/157 |
| 2006/0104399 A1 | 5/2006 | Byun et al. | |
| 2008/0007365 A1 * | 1/2008 | Venuti | H03C 3/0925 331/179 |

* cited by examiner

CHARGE PUMP CALIBRATION FOR DUAL-PATH PHASE-LOCKED LOOP

TECHNICAL FIELD

Embodiments of the invention generally relate to the field of electronic circuits, and, more particularly, to charge pump calibration for a dual-path phase-locked loop.

BACKGROUND

A phase-locked loop (PLL), also referred to as a phase lock loop, is a circuit or other mechanism that generates an output signal, where the phase of the output signal has a relation to the phase of an input signal.

In general, a PLL receives an input signal, and a variable frequency oscillator generates a periodic output signal utilizing such input signal. A phase detector then compares a phase of the output signal with a phase of the input periodic signal, and provides an adjustment to the oscillator in order to match such phases. A PLL includes a feedback loop feed the output signal back to the input of the PLL. More specifically, a dual-path PLL includes multiple forward paths, the paths including a proportional path (P-path) and an integral path (I-path).

However, a dual-path analog PLL including charge pumps in both the proportional path and the integral path generates jitter that is difficult to address with conventional means.

BRIEF DESCRIPTION OF THE DRAWINGS

Embodiments of the invention are illustrated by way of example, and not by way of limitation, in the figures of the accompanying drawings in which like reference numerals refer to similar elements.

SUMMARY

Figure 1:
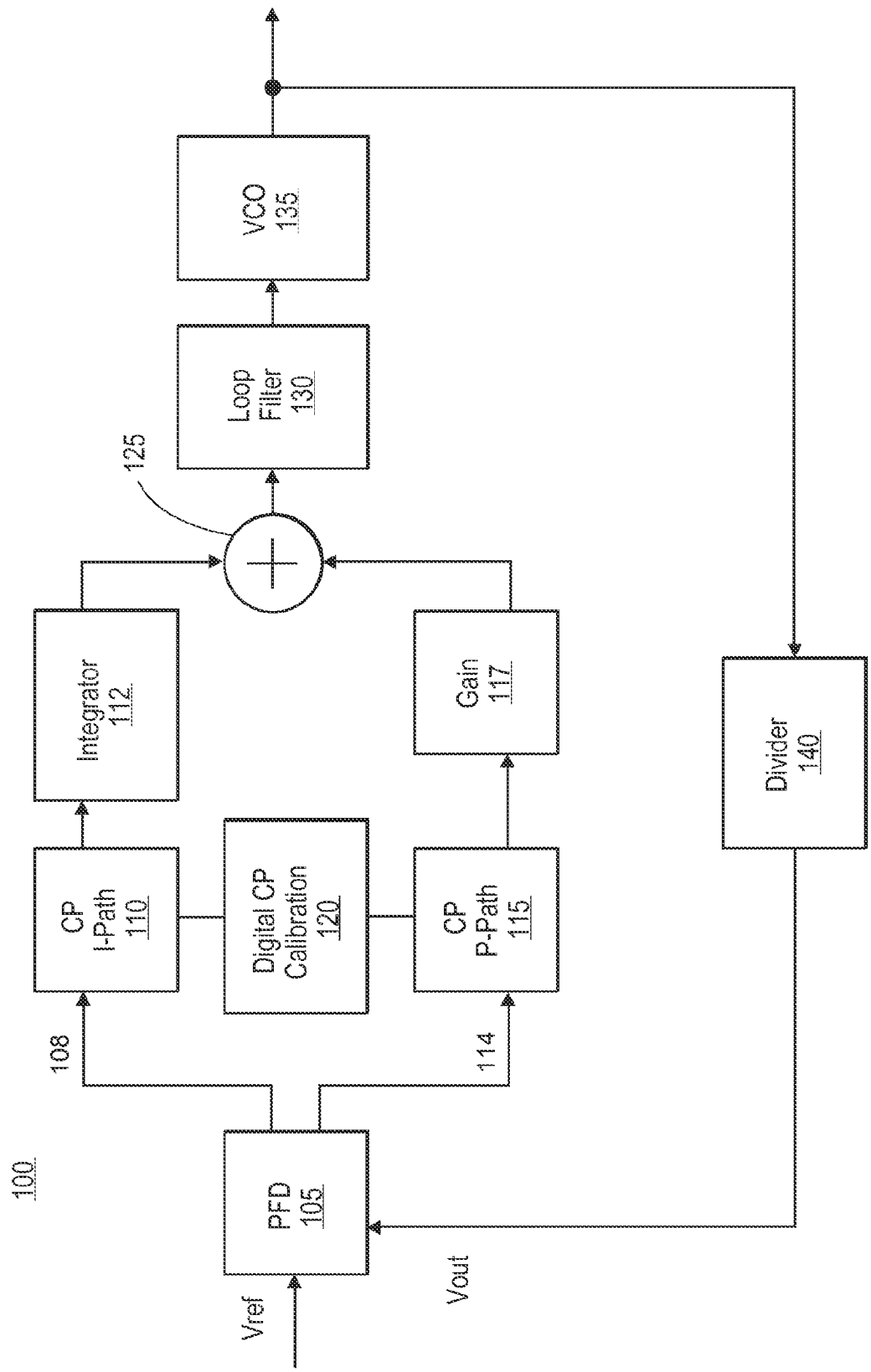
FIG. 1 illustrates an embodiment of a dual-path phase-locked loop circuit or other mechanism.

Embodiments of the invention are generally directed to charge pump calibration for a dual-path phase-locked loop circuit.

In a first aspect of the invention, an apparatus includes a phase frequency detector; an integral path including a first charge pump; a proportional path including a second charge pump; and a calibration mechanism for the first charge pump and the second charge pump, the calibration mechanism including a phase detector to detect whether a reference clock signal or a feedback clock signal is leading or lagging in phase and to generate a signal indicating which clock signal is leading or lagging, a first memory element and a second memory element to store the signal from the phase detector, a first control logic to adjust current for the first charge pump based on the value stored in the first memory element, and a second control logic to adjust current for the second charge pump based on the value stored in the second memory element.

In a second aspect of the invention, a method includes receiving a reference clock signal at a dual-path phased-lock loop having an integral path and a proportional path, the phased-lock loop generating a feedback clock signal; comparing phases of the reference clock signal and the feedback clock signal with a phase detector and generating data indicating which clock signal is leading or lagging; storing sampled data from the phase detector in a first memory element and a second memory element; adjusting current for a first charge pump of the integral path based on the sampled value stored in the first memory element, and adjusting current for a second charge pump of the proportional path based on the value stored in the second memory element.

In a third aspect of the invention, a calibration mechanism for a phased-lock loop circuit includes a phase detector to detect whether a reference clock signal or a feedback clock signal is leading or lagging in phase and to generate a signal indicating which clock signal is leading or lagging, the feedback clock signal being generated by the phased-lock loop circuit; a first memory element and a second memory element to store the signal from the phase detector; a first control logic to adjust current for a first charge pump of an integral path of the phased-lock loop based on the value stored in the first memory element; and a second control logic to adjust current for a second charge pump of a proportional path of the phased-lock loop based on the value stored in the second memory element.

DETAILED DESCRIPTION

Embodiments of the invention are generally directed to charge pump calibration for a dual-path phase-locked loop circuit.

As used herein, "dual-path phase-locked loop" or "dual-path PPL" refers to a phase-locked loop circuit or other mechanism that includes at least two separate forward paths, the forward paths including a proportional path (P-path) and an integral path (I-path). A dual-path phase-locked loop is sometimes referred to as a "dual-loop phase-locked loop".

FIG. 1 illustrates an embodiment of a dual-path phase-locked loop circuit or other mechanism. For clarity, all possible elements of the circuit or mechanism are not illustrated in FIG. 1. In some embodiments, a dual-path PPL 100 includes a phase frequency detector (PFD) 105 receiving a reference clock signal $v_{ref}$ as a first input. As shown in FIG. 1, the dual-path PLL 100 includes two forward paths, a proportional path (P-path) 114 and an integral path (I-path) 108. The I-path includes a first charge pump, indicated as CP I-Path 110, for the I-path 108 and a second charge pump, indicated as CP P-path 115, for the P-path 114. The I-path 108 includes an integrator element 112, such as a capacitor, and the P-path 114 includes a gain element 117, such as a resistor. In operation, the proportional path 114 is to determine a loop bandwidth of the dual-path PLL 100, while integral path 108 is to adjust damping of the PLL according to the loop bandwidth. The signals from the I-path 108 and the P-path 114 are added, such as by adder 125. The PPL 100 further includes a loop filter or filters 130 receiving the output from the adder 125, and a voltage controlled oscillator 135, receiving the output from the loop filter or filters 130. Also illustrated is a divider circuit or element 140 in a feedback loop to generate an output voltage $V_{out}$, which is provided as a second input to the phase frequency detector 105.

For a dual-path analog PLL having charge pumps in both the P-path and the I-path, dynamic mismatch of the I-path charge pump will induce static phase error, bringing about a certain amount of determinant jitter (DJ). Further, dynamic mismatch of the P-path charge pump will also contribute to DJ directly without inducing static phase error. In some embodiments, in order to minimize DJ, a circuit or other mechanism provides for reducing dynamic mismatches of both the I-path and the P-path.

In some embodiments, the determinant jitter can be identified using a reference spur. When a PLL locks, charge pump output is proportional to determinant jitter. Reference spurs in the output are caused by the charge pump output being continuously updated at the reference frequency rate. Thus, determinant jitter can be identified using detected reference spurs. The reference spurs in the RF output occur at offset frequencies that are integer multiples of the reference frequency $f_{REF}$.

A common method to reject reference spurs is to add a higher order pole to the loop filter. However, in such operation there is a compromise between filtering the reference spurs and the PLL phase margin. In addition, when shifting to a PLL system with a different reference frequency, it is necessary to redesign the pole location in order to maintain the same rejection effect for the reference spurs.

In some embodiments, a method, apparatus, or system provides for digital charge pump calibration 120 for a dual-path phase-locked loop.

Digital calibration of a charge pump for a single loop PLL is present in certain existing systems. However, for a dual-path PLL, because the I/P-path charge pumps are independent, the mismatch that finally results may, for example, be mainly from the P-path, or may be the remaining part after I/P-path cancelling. For this reason, if calibration is structured only for a single loop, the determinant jitter for a dual-path PLL may improve very little, or may potentially become worse after the calibration.

In some embodiments, a dual-path calibration consists of both I-path calibration and P-path calibration:

(a) I-path calibration detects the PLL's static phase error utilizing a phase detector, and provides compensation to the I-path charge pump accordingly; and (b) P-path calibration detects VCO's phase fluctuation during a reference cycle through generating an edge right in the middle of one reference clock and comparing with a phase detector, and providing compensation to the P-path charge pump accordingly. In some embodiments, a phase detector is a BBPD (Bang-Bang Phase Detector), which provides sign information of phase error and not magnitude, but embodiments are not limited to a particular type of phase detector.

Figure 2A:
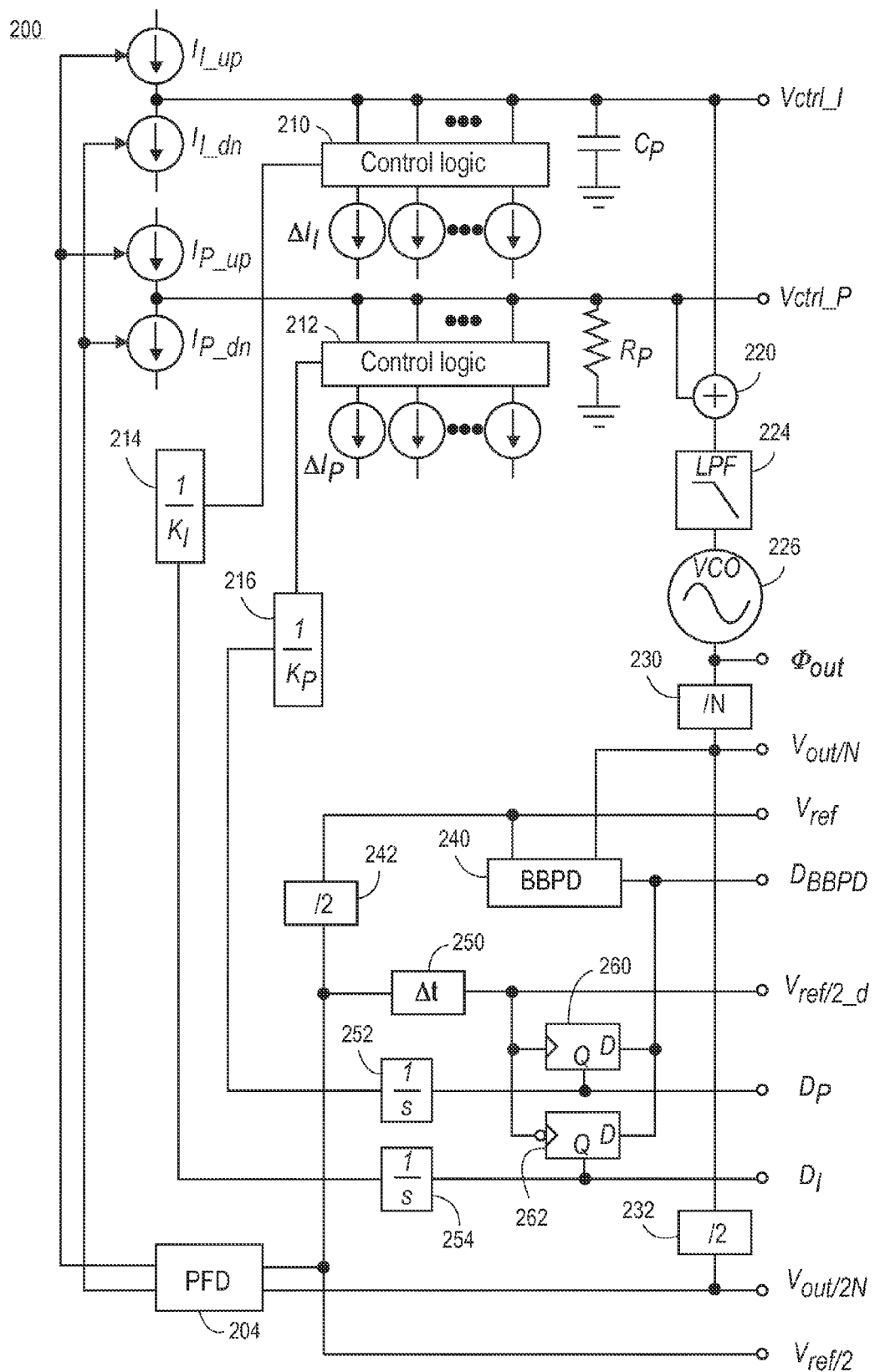
FIG. 2A illustrates an embodiment of a calibration mechanism for a dual-path phase-locked loop.
Figure 2B:
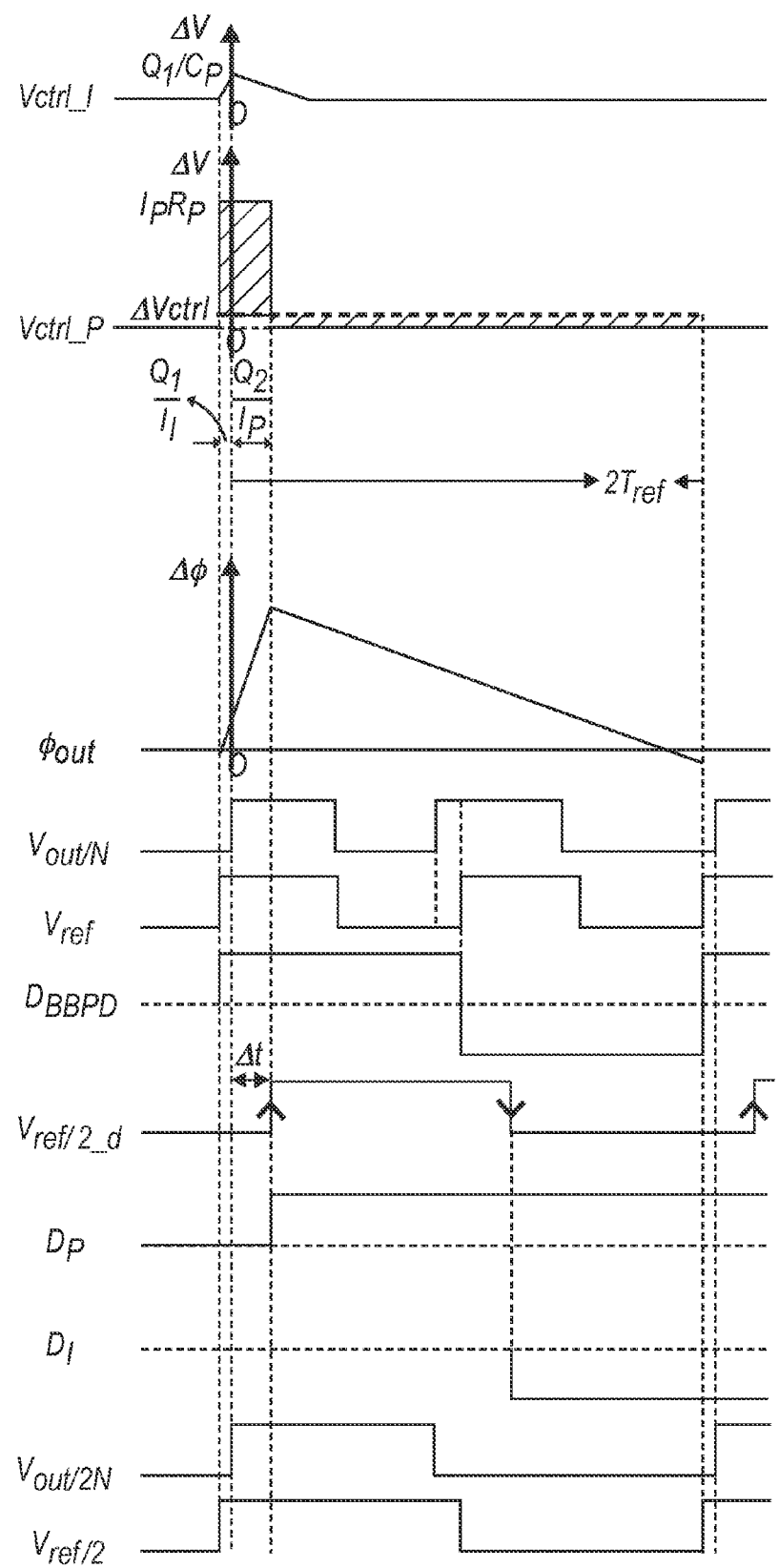
FIG. 2B is a timing diagram to illustrate an embodiment of a process for calibration of a dual-path phase-locked loop.

FIGS. 2A and 2B illustrate calibration of a dual-path PLL according to an embodiment. FIG. 2A illustrates an embodiment of a calibration mechanism for a dual-path phase-locked loop 200, and FIG. 2B is a timing diagram to illustrate an embodiment of a process for calibration of a dual-path phase-locked loop.

Calibration methods for the I-path and P-path can be divided into three parts, detection, filtering and compensation, as follows:

(1) Compensation: In general for a phased-locked loop, the phase difference between the reference clock signal and the output/feedback signal is translated into signals UP and DN, where the two signals control switches to steer current into or out of a capacitor, causing the voltage across the capacitor to increase or decrease. In each cycle, the time during which the switch is turned on is proportional to the phase difference, and thus the charge delivered is dependent on the phase difference. The voltage on the capacitor is used to tune the voltage-controlled oscillator (VCO), generating the desired output signal frequency.

As shown in FIG. 2A, a phase frequency detector 204 provides a first output to current sources $I_{I\_up}$ for the I-path and $I_{P\_up}$ for the P-path, and a second output to current sources $I_{I\_dn}$ for the I-path and $I_{P\_dn}$ for the P-path. In some embodiments, compensation for both the I-path and the P-path is performed through adjusting the UP/DN charge pump currents. In some embodiments, the PPL 200 includes a first control logic 210 for the I-path to provide adjustment in the charge pump current for the I-path and a second control logic 212 for the P-path to provide adjustment in the charge pump current for the P-path.

As further illustrated in FIG. 2A, a capacitor $C_P$ (an integrator element) is included in the I-path, which generates signal $V_{ctrl\_I}$, and a resistor $R_P$ (a gain element) is included in the P-path, which generates signal $V_{ctrl\_P}$. The voltages $V_{ctrl\_I}$ and $V_{ctrl\_P}$, as illustrated in FIG. 2B, are added by adder 220. The output of adder 220 is filtered by low pass filter (LPF) 224, with the output of LPF 224 being received by voltage controlled oscillator (VCO) 226 to generate the phase output $\Phi_{out}$, as shown in FIG. 2B. The output of VCO 226 is divided by N by divider 230 to generate $V_{out/N}$.

(2) Detection: If there is mismatch in the I-path charge pump current $I_{I\_up}$ and $I_{I\_dn}$, which is quantized in an electric quantity Q (shown in FIG. 2B) in each PLL updating cycle, PLL 200 will generate a static phase error $Q1/I_I$ to compensate the current so that the voltage on capacitor $C_P$ is stabilized in order to cause the PLL to lock. The voltage on capacitor $C_P$ is illustrated in FIG. 2B as Vctrl_I.

The P-path charge pump's mismatch in current $I_{P\_up}$ and $I_{P\_dn}$ is recorded as quantity $Q_2$. This mismatch $Q_2$ is equivalent to a static phase error of $Q_2/I_P$ when PLL 200 has no P path mismatch, which, for ease of illustration, is illustrated in FIG. 2B as following beside the static phase error $Q1/I_I$. In the total mismatch induced P-path phase error $Q_1/I_I+Q_2/I_P$, Vctrl_P is $I_P \times R_P$, which will contribute to the VCO 226 output $\Phi$out. The value Vctrl_P is illustrated in FIG. 2B.

Static phase error $Q_1/I_I$ is embodied both in the misalignment of $V_{ref}$ and $V_{out}/N$ and in the misalignment of $V_{ref}/2$ and Vout/2N. Therefore, at the beginning of each updating cycle, $\Phi_{out}$ is not zero. In the middle of the updating cycle, the fluctuation of Vctl_P fluctuation will cause $\Phi_{out}$ to fluctuate. Fluctuation of Vctl_P and resulting fluctuation of $\Phi_{out}$ are shown in FIG. 2B.

To summarize, static phase error is caused by I-path mismatch and phase fluctuation during an updating cycle is caused by P-path mismatch. In some embodiments, a method and apparatus are provided to address both such sources of phase error.

In some embodiments, both a reference clock and a feedback clock are divided by 2 and provided them to the PFD. As illustrated in FIG. 2A, because P-path mismatch can induce phase fluctuation during a reference cycle, the reference clock ($V_{ref}$) by divided by 2, by divider 242, to generate a new reference cycle $V_{ref2}$ that is provided to PFD 204. As a result, there is an edge right in the middle of the new reference cycle as the criterion to identify the polarity of fluctuation with the assistance of a phase detector, BBPD (Bang-Bang Phase Detector) 240, and the compensation may be provided accordingly.

In some embodiments, an original reference clock and original feedback clock are compared utilizing phase detector BBPD 240. As illustrated in FIG. 2A, BBPD 240 receives inputs Vref and $V_{out}/N$, and generates signal $D_{BBPD}$.

In some embodiments, the new reference clock is delayed by Δt, and the delayed clock is used to sample BBPD 240 output separately with both edges to different registers or other memory element. As illustrated, signal $D_{BBPD}$ is provided to flip-flop (FF) 260 and FF 262 (illustrated as containing an inverted input), which are clocked by the falling and rising edges of $V_{ref/2\_d}$, being the reference clock signal divided by 2 and delayed by Δt. The output from FF 260 is multiplied by 1/S 252 and gain $1/K_P$ 216 to provide a control signal to control logic 212 of the P-path, thus generating current compensation $ΔI_P$, with the output from FF 262 is multiplied by 1/S 254 and gain $1/K_I$ 214 to provide a control signal to control logic 210 of the I-path, thus generating current compensation $ΔI_I$. The factors 1/S 252 and $1/K_P$ 216 for the P-path and factors 1/S 254 and $1/K_I$ 214 for the I-path form a filter for each path to filter out quantization noise of 240 BBPD 240, which will continue to toggle between lead and lag states even when the calibration has been completed. It is noted that, because the reference clock frequency is divided by 2, the divider 230 after the VCO is increased from N to 2N, and thus the output is divided by 2, by divider 232, to generate $V_{out}/2N$.

For the I-path, the dynamic mismatch can induce static phase error. In some embodiments, the BBPD 240 is used to detect the static phase error's polarity and make compensation accordingly. In some embodiments, the same BBPD 240 may be used to accomplish both detections as they both happen in one new reference cycle. The detection results are recorded by the signal $D_{BBPD}$.

In some embodiments, in order to distinguish between I-path mismatch detection and P-path mismatch detection, the reference clock is delayed by Δt 250, and the delayed reference clock is used to sample the I-path mismatch detection and I-path mismatch detection and P-path mismatch detection P-path mismatch detection separately with both edges.

In some embodiments, the data sampled by the rising edge of the delayed reference clock is followed by an accumulator and shifter in series. The data after the shifter is used as the input of the DAC (Digital-to-Analog Converter) in the integral path charge pump. In FIG. 2A, the accumulator, shifter, and DAC are contained in the control logic 210.

In some embodiments, data sampled by the falling edge of the delayed reference clock is followed by an accumulator and shifter in series. The data after the shifter is used as the input of the DAC in the proportional path charge pump. In FIG. 2A, the accumulator, shifter, and DAC are contained in the control logic 212.

(3) Filtering: In some embodiments, if the original reference clock leads the original feedback clock, a value '1' is registered (stored in a memory element), and otherwise a value '−1' is registered. If the I-path and P-path mismatches have not been totally corrected, the polarities of separated results $D_I$ and $D_P$ do not change. In some embodiments, one or more accumulators are used to accumulate the results until the mismatches are corrected to below the capability of 1LSB (one least significant bit). At this point, $D_I$ and $D_P$ will then toggle between "−1" and "1" and the accumulator output is stabilized. In some embodiments, to provide stability, the gains ($1/K_I$ and $1/K_P$) of the two calibration loops are adjusted.

Figure 2C:
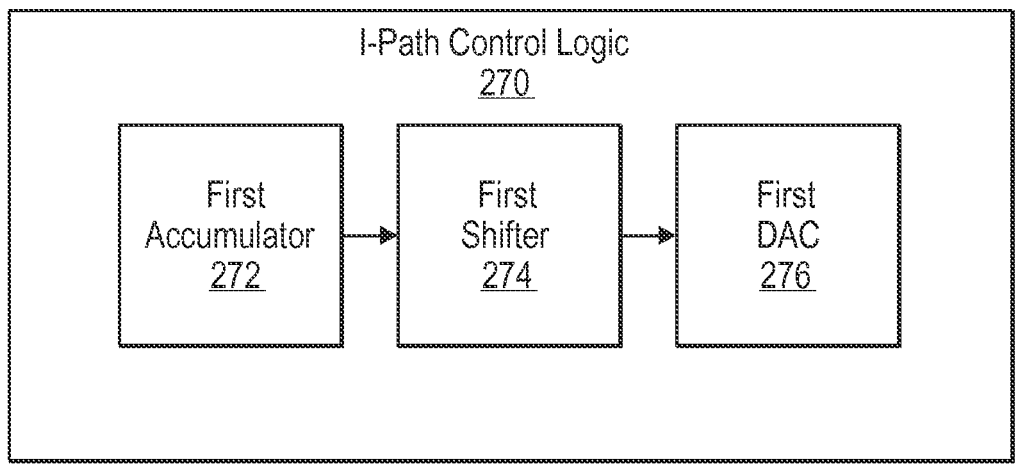
FIG. 2C illustrates components of phase-locked loop control logic for the I-path and the P-path according to an embodiment.
Figure 2C:
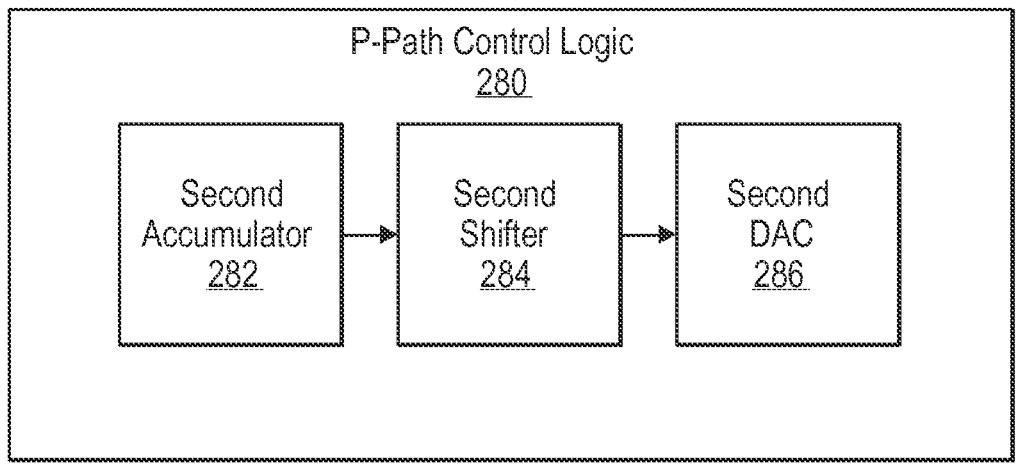

FIG. 2C illustrates components of phase-locked loop control logic for the I-path and the P-path according to an embodiment. FIG. 2C does not include all components that may be included in such control logic. In some embodiments, a dual-path PLL includes I-path control logic 270, such as control logic 210 illustrated in FIG. 2A, and P-path control logic 280, such as control logic 212 illustrated in FIG. 2A.

In some embodiments, the I-path control logic 270 includes a first accumulator 272 to receive phase detection data for the I-path. A first accumulated output of the first accumulator 272 is provided to a first shifter 274. A first shifted output of the first shifter is provided to a first DAC 274 to generate a first control value, which is utilized in adjusting the current in the I-path.

In some embodiments, the P-path control logic 280 includes a second accumulator 282 to receive phase detection data for the IP-path. A second accumulated output of the second accumulator 282 is provided to a second shifter 284. A second shifted output of the second shifter is provided to a second DAC 284 to generate a second control value, which is utilized in adjusting the current in the P-path.

In a PLL circuit, the use of a charge pump naturally adds a pole at the origin in the loop transfer function of the PLL because the charge-pump current is driven into a capacitor to generate a voltage (V=I/(sC)). The additional pole at the origin is desirable because, when considering the closed-loop transfer function of the PLL, this pole at the origin integrates the error signal and causes the system to track the input with one more order.

To illustrate mathematically the calibration of the dual-path PLL, if it is assumed the dead zone extension pulse width of the PFD is $t_{on}$, a transfer function of the calibrated loop is:

$$G(s) = \frac{I_P K_{VCO}}{N \cdot s} \left[ R_P \left(1 + \frac{\omega_P}{s}\right) + \frac{1}{sC_P}\left(1 + \frac{\omega_I}{s}\right) \right], \quad [1]$$

$$\omega_P = \frac{f_{ref}}{K_P} \frac{t_{on}}{t_{in}} \frac{\Delta I_P}{I_P}, \omega_I = \frac{f_{ref}}{K_I} \frac{t_{on}}{t_{in}} \frac{\Delta I_I}{I_I}$$

Reorganizing the transfer function of the calibrated loop results in the following:

$$G(s) = \frac{I_P R_P K_{VCO}}{N \cdot s} \left(1 + \frac{\omega_Z + \omega_P}{s} + \frac{\omega_I \omega_Z}{s^2}\right) \quad [2]$$

Figure 3:
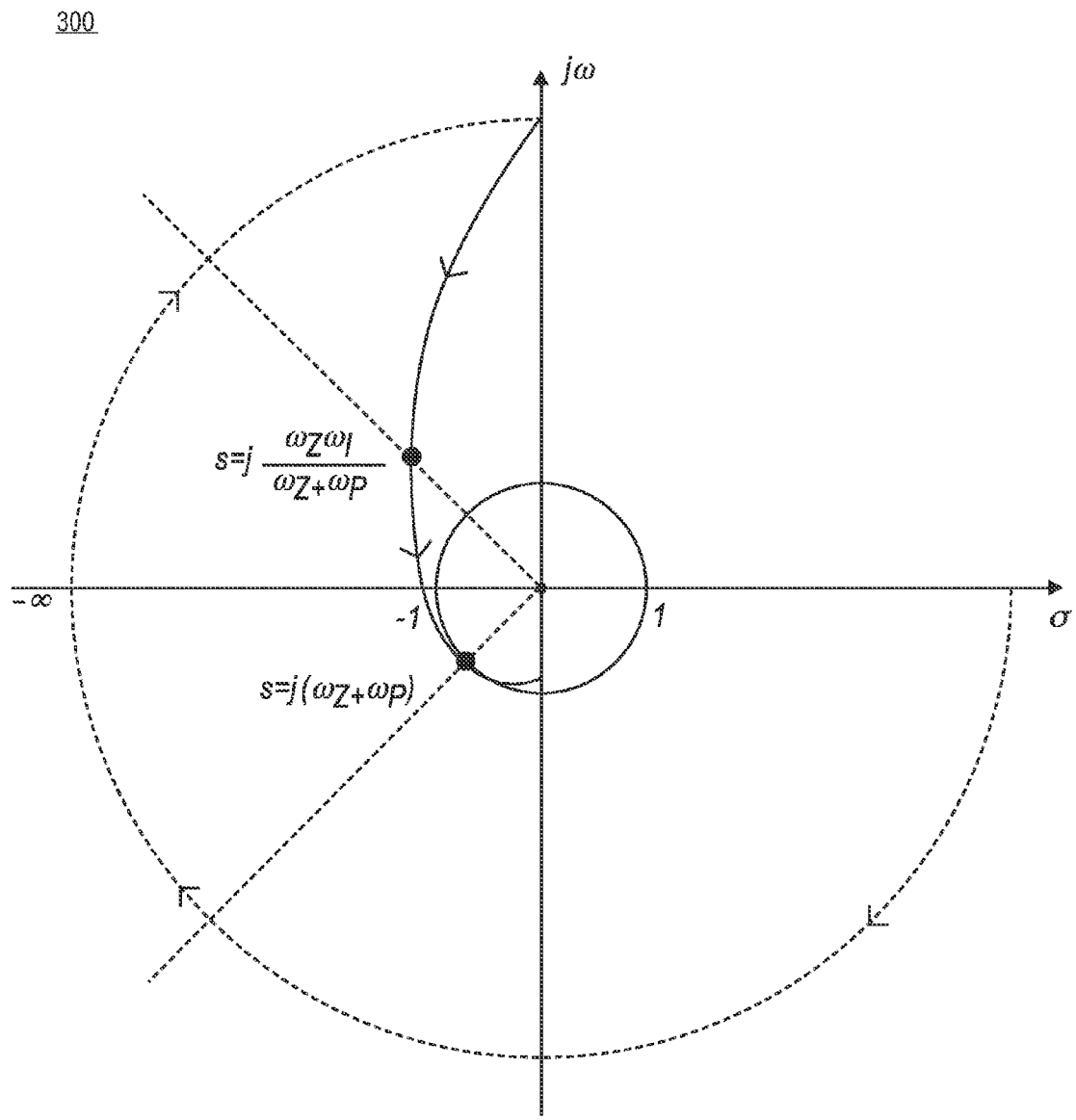
FIG. 3 is an illustration of a Nyquist curve of a transfer function of a dual-path phase-locked loop.

FIG. 3 is an illustration of a Nyquist curve of a transfer function of a dual-path phase-locked loop. To provide stability, the Nyquist curve 300 of the transfer function should be as illustrated in FIG. 3. Based on this, the following results:

$$\omega_Z + \omega_P \gg \frac{\omega_Z \omega_I}{\omega_Z + \omega_P} \quad [3]$$

In order to maintain phase margin, another requirement that should be satisfied is the following:

$$\omega_Z \gg \omega_P \quad [4]$$

Base on the combination of equations [3] and [4], the following is the resulting requirement:

$$\omega_Z \gg \omega_I \quad [5]$$

Figure 4:
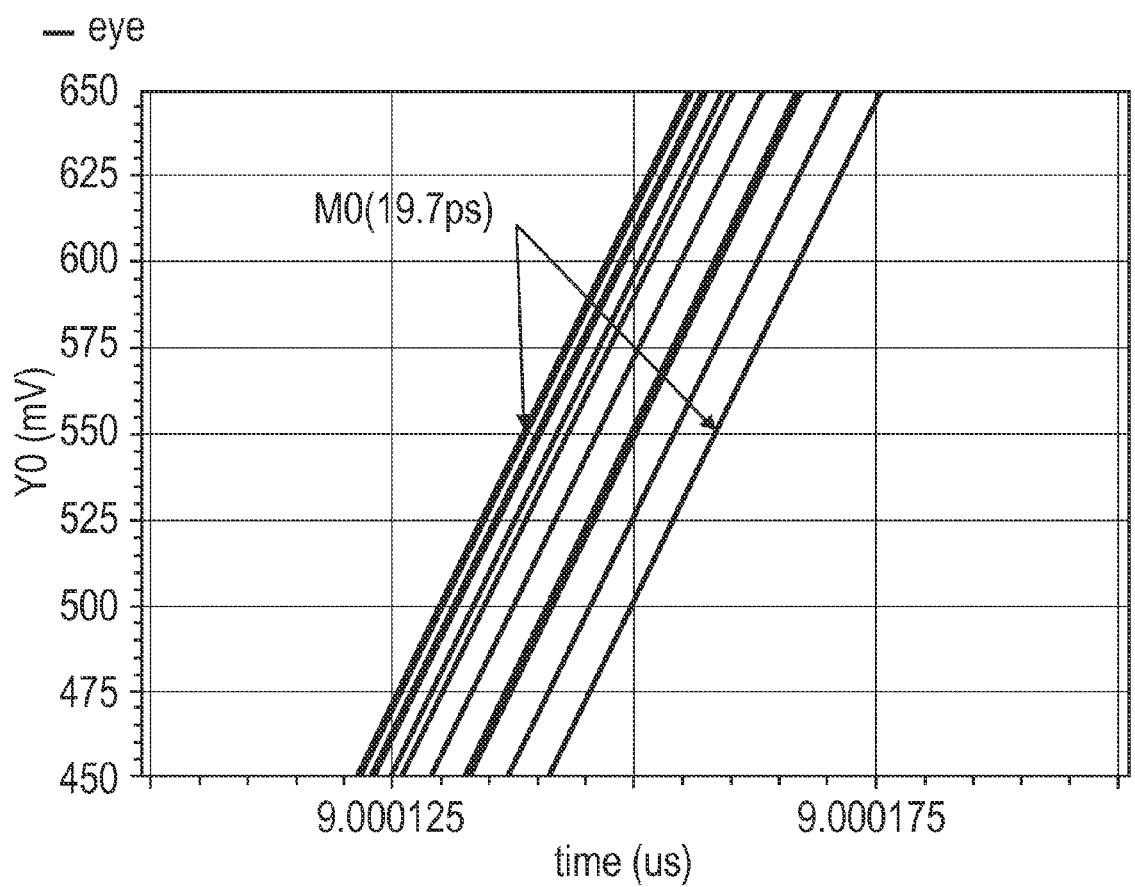
FIG. 4 is an illustration of dual-path phase-locked loop jitter without calibration.

FIG. 4 is an illustration of dual-path phase-locked loop jitter without calibration. In this modeled illustration, reasonable charge pump mismatches are included. As shown in the illustration, there is determinant jitter in the range of 19.7 picoseconds (ps) in the modeled signals.

Figure 5:
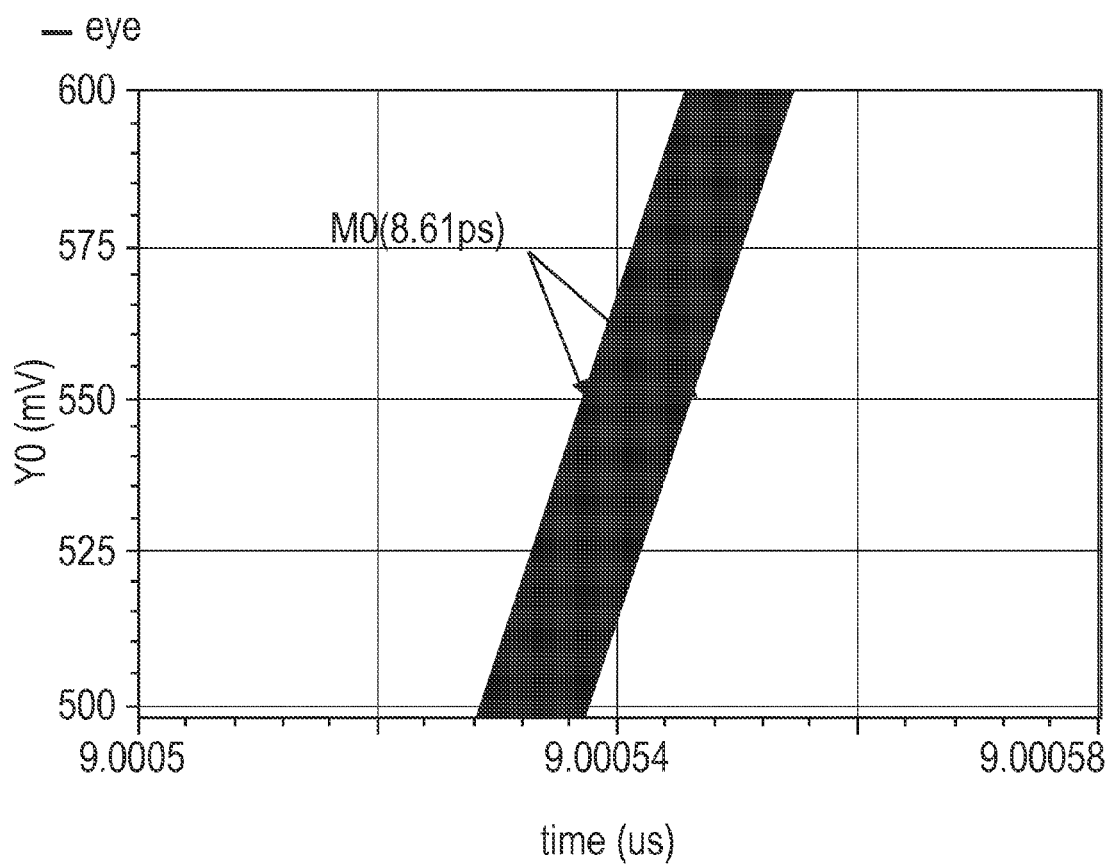
FIG. 5 is an illustration of dual-path phase-locked loop jitter according to an embodiment.

FIG. 5 is an illustration of dual-path phase-locked loop jitter according to an embodiment. In this modeled illustration, $K_I$ and $K_P$ have been chosen and calibration loops have been added. As shown, the determinant jitter has been greatly reduced, with a value of 4.46 femtoseconds (fs), or an improved DJ performance by a ratio of approximately 5,000.

Figure 6:
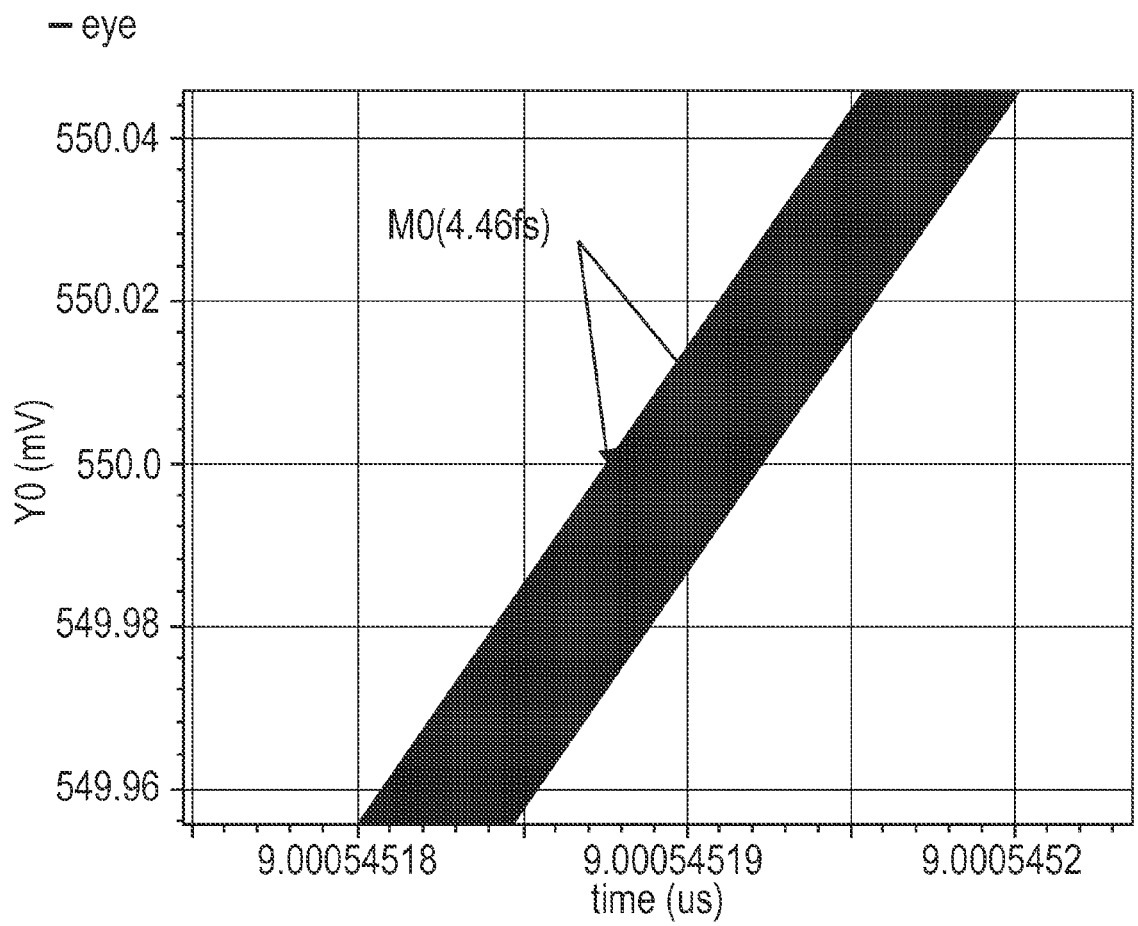
FIG. 6 is an illustration of dual-path phase-locked loop jitter using single loop calibration.

FIG. 6 is an illustration of dual-path phase-locked loop jitter using single loop calibration. In contrast with FIG. 5, FIG. 6 illustrates a modeled outcome utilizing single-loop calibration in which there is only I-path charge pump calibration. The resulting determinant jitter is approximately 8.61 ps, thus providing a determinant jitter improvement of only a ratio of 2 compared to FIG. 4.

Calibration of a dual-path PLL according to an embodiment allows for the following:

(1) The I-path charge pump and P-path charge pump may be calibrated separately and simultaneously.

(2) A calibration loop may be implemented with only 3 stages of DFF (D Flip-Flop), which can be synthesized to a high frequency and can be applied to PLL with a high reference frequency.

(3) A calibration loop may be mainly composed of digital components and several branches of current source, which allows ease of integration and area efficiency.

(4) Calibration is background calibration, which can track PVT (Process-Voltage-Temperature) variation when the PLL is working. With the greater design difficulties that are brought by process minimization for electronic components and devices, the calibration may be utilized in a PLL to save design time and improve manufacturing yield.

(5) A calibration loop gain may be designed to be very small without sacrificing jitter performance, with the calibration being unrelated to the PLL's reference frequency, and thus the calibration implementation may be easily transferred to PLLs under different standards.

Figure 7:
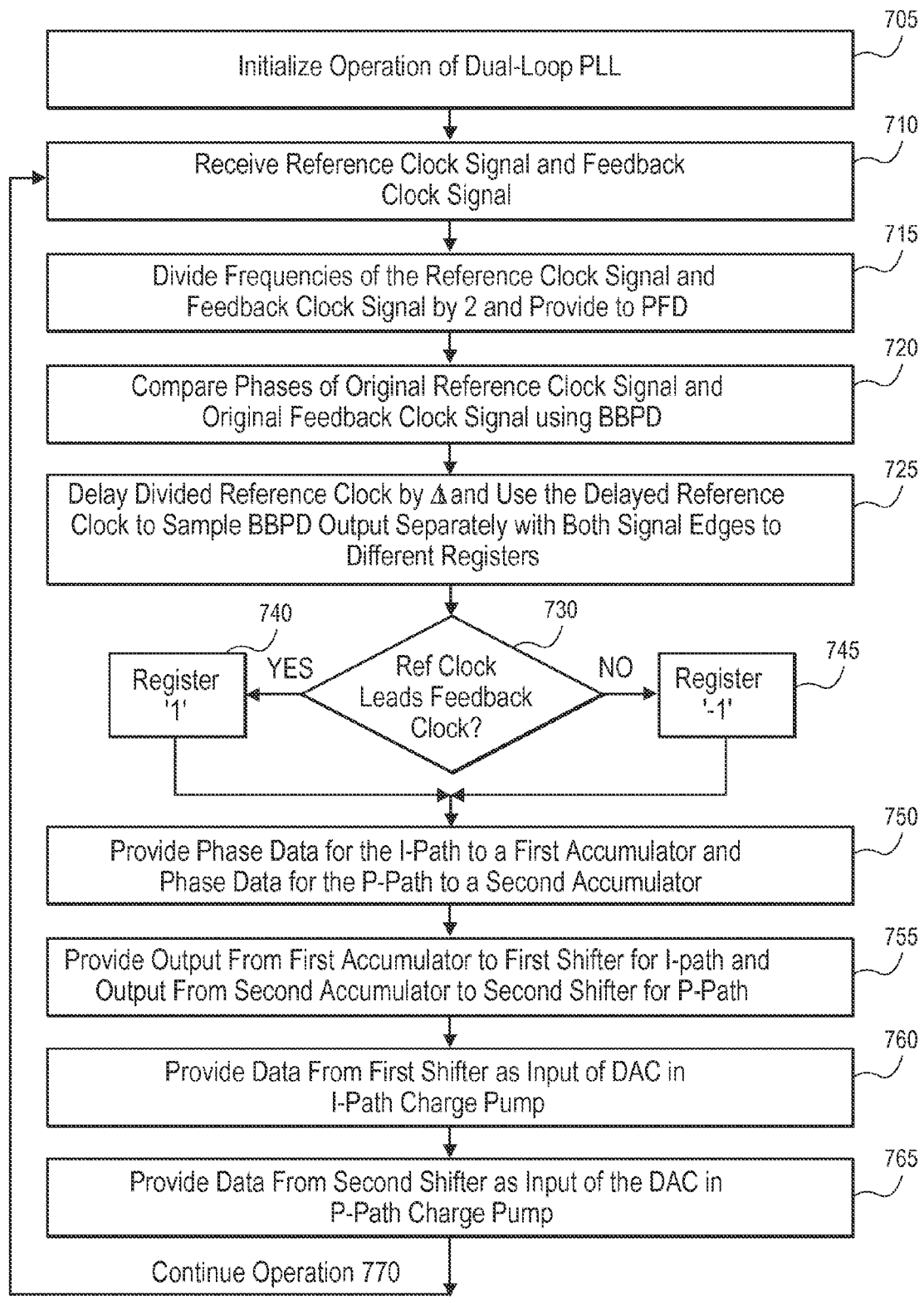
FIG. 7 is a flow chart to illustrate an embodiment of a process for digital compensation for a dual-path phase-locked loop.

FIG. 7 is a flow chart to illustrate an embodiment of a process for digital compensation for a dual-path phase-locked loop. While for purposes of illustration the elements of the process are shown in a particular sequence, the process is performed in a feedback loop and thus certain processes occur simultaneously. In some embodiments, after initializing operation of a dual-path phased-lock loop 705, a reference clock and a feedback clock signal are received 710, with the reference clock and feedback clock signals being divided by 2 and provided to the phase frequency detector 715.

In some embodiments, the original reference clock and the original feedback are compared using, for example, a BBPD 720, with new divided reference clock being delayed by Δt and being used to sample BBPD output separately with both (leading and trailing) edges to separate registers or other memory elements 725, including, for example, flip-flops 260 and 262 illustrated in FIG. 2A. In some embodiments, the BBPD result at the beginning of a new reference cycle is directed to the I-Path, and the BBPD result at the middle of a new reference cycle is direct to the P-Path. In some embodiments, if the reference clock signal is leading the feedback clock signal 730 a value of '1' is registered 740, with a value of '-1' registered otherwise 745. However, the reverse values may be also be used. In addition, embodiments are not limited to these particular phase detection output values.

In some embodiments, data for the I-path is directed to a first accumulator, and data for the P-path is directed to a second accumulator 750. In some embodiments, an output from the first accumulator is then provided to a first shifter for the I-path, and an output from the second accumulator is provided to a second shifter for the P-path to provide gain for the data values 755.

In some embodiments, data from the first shifter is provided as the input of the DAC of the integral path charge pump 760 and data from the second shifter is used as the input of the DAC of the proportional path charge pump 765 to address signal mismatch.

In some embodiments, the process continues during operation of the dual-path phase-locked loop 770.

Figure 8:
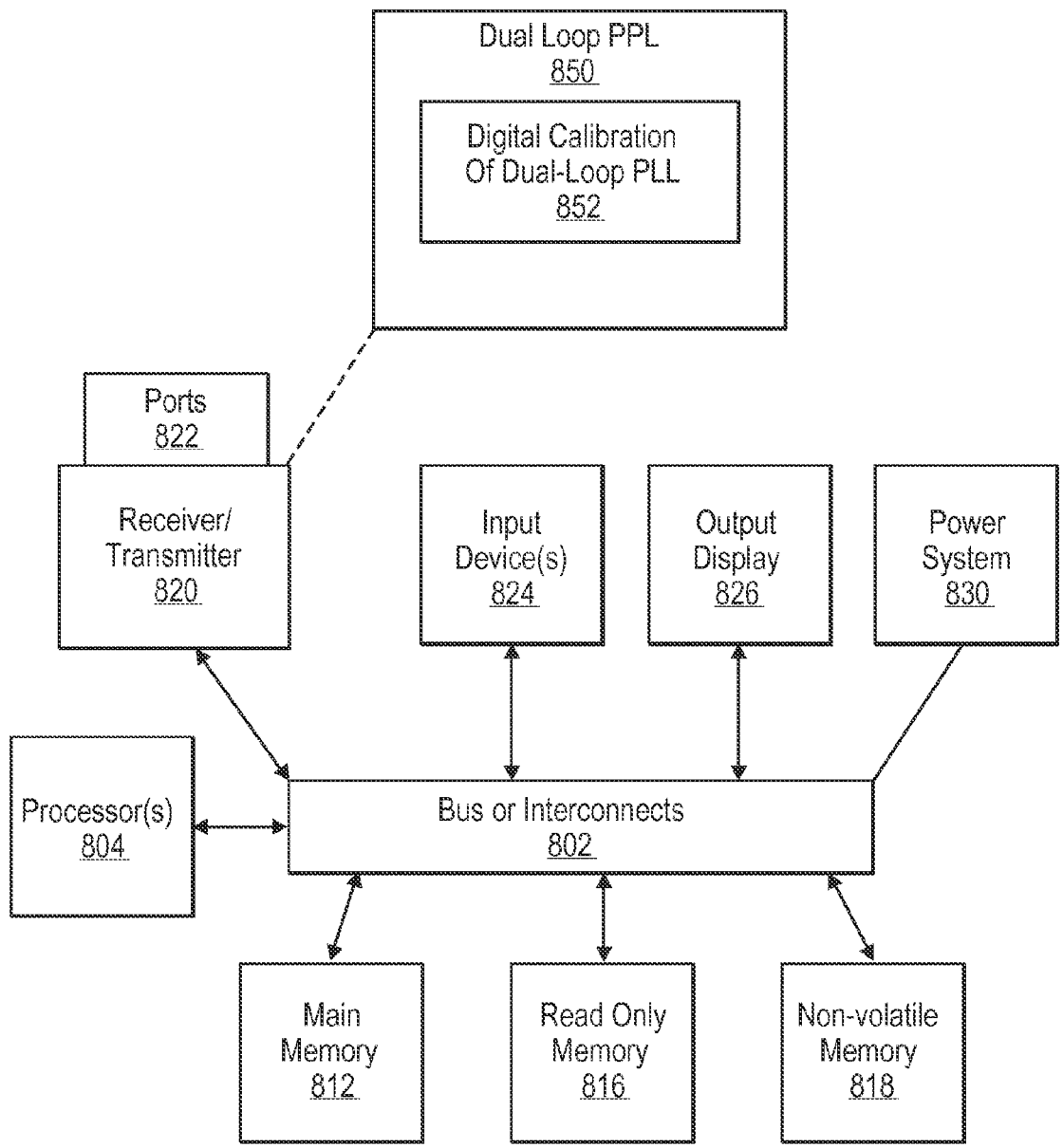
FIG. 8 is an illustration of an apparatus or system including a dual-path phase locked loop according to an embodiment.

FIG. 8 is an illustration of an apparatus or system including a dual-path phase locked loop according to an embodiment. In some embodiments, one or more transmitters or receivers 820 may also be coupled with an interconnect 802. In some embodiments, the receivers or transmitters 820 may include one or more ports 822 for the connection of other apparatuses. The interconnect 802 is illustrated as a single interconnect for simplicity, but may represent multiple different interconnects or buses and the component connections to such interconnects may vary. The interconnect 802 shown in FIG. 8 is an abstraction that represents any one or more separate physical buses, point-to-point connections, or both connected by appropriate bridges, adapters, or controllers.

In some embodiments, the transmitters or receivers 820 include a dual-path phased lock loop circuit or mechanism 850 to, for example, assist in recovery of a received signal. However, embodiments of systems are not limited to this operation, or to use in a signal receiver. In some embodiments, the phased-lock loop 850 includes a circuit or other mechanism 852 for digital calibration of the PLL 850. In some embodiments, the circuit or mechanism is as illustrated in FIG. 2A.

In some embodiments, the apparatus may further include the following:

The apparatus 800 may include a processing means such as one or more processors 804 coupled with the interconnect 802 for processing information. The processors 804 may comprise one or more physical processors and one or more logical processors.

In some embodiments, the apparatus 800 further comprises a random access memory (RAM) or other dynamic storage device or element as a main memory 812 for storing information and instructions to be executed by the processors 804. In some embodiments, main memory may include active storage of applications including a browser application for using in network browsing activities by a user of the apparatus 800. In some embodiments, memory of the apparatus may include certain registers or other special purpose memory.

The apparatus 800 also may comprise a read only memory (ROM) 816 or other static storage device for storing static information and instructions for the processors 804. The apparatus 800 may include one or more non-volatile memory elements 818 for the storage of certain elements, including, for example, flash memory and a hard disk or solid-state drive.

The apparatus 800 may also be coupled via the interconnect 802 to an output display 826. In some embodiments, the display 826 may include a liquid crystal display (LCD) or any other display technology, for displaying information or content to a user, including three-dimensional (3D) displays. In some environments, the display 826 may include a touch-screen that is also utilized as at least a part of an input device. In some environments, the display 826 may be or may include an audio device, such as a speaker for providing audio information.

In some embodiments, an apparatus or system 800 (generally referred to herein as an apparatus) includes a power system 830, which may include a power supply, a battery, a solar cell, a fuel cell, or other system or device for providing or generating power. The power provided by the power device or system 830 may be distributed as required to elements of the apparatus 800.

In the description above, for the purposes of explanation, numerous specific details are set forth in order to provide a thorough understanding of the present invention. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described. The illustrated elements or components may also be arranged in different arrangements or orders, including the reordering of any fields or the modification of field sizes.

The present invention may include various processes. Embodiments of processes may be performed by hardware components or may be embodied in computer-readable instructions, which may be used to cause a general purpose or special purpose processor or logic circuits programmed with the instructions to perform the processes. Alternatively, the processes may be performed by a combination of hardware and software.

Portions of embodiments may be provided as a computer program product, which may include a computer-readable non-transitory storage medium having stored thereon computer program instructions, which may be used to program a computer (or other electronic devices) to perform a process according to the embodiments. The computer-readable storage medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/computer-readable medium suitable for storing electronic instructions. Moreover, embodiments may also be downloaded as a computer program product, wherein the program may be transferred from a remote computer to a requesting computer.

Many of the methods are described in their most basic form, but processes may be added to or deleted from any of the methods and information may be added or subtracted from any of the described messages without departing from the basic scope of the present invention. It will be apparent to those skilled in the art that many further modifications and adaptations may be made. The particular embodiments are not provided to limit the invention but to illustrate it.

If it is said that an element "A" is coupled to or with element "B," element A may be directly coupled to element B or be indirectly coupled through, for example, element C. When the specification states that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification refers to "a" or "an" element, this does not mean there is only one of the described elements.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects.

In some embodiments, an apparatus includes a phase frequency detector; an integral path including a first charge pump; a proportional path including a second charge pump; and a calibration mechanism for the first charge pump and the second charge pump including: a phase detector to detect whether a reference clock signal or a feedback clock signal is leading or lagging in phase and to generate a signal indicating which clock signal is leading or lagging, a first memory element and a second memory element to store the signal from the phase detector, a first control logic to adjust current for the first charge pump based on the value stored in the first memory element, and a second control logic to adjust current for the second charge pump based on the value stored in the second memory element.

In some embodiments, the apparatus further includes a first divider to divide a frequency of the reference clock signal by 2, the divided reference clock signal to be provided to the phase frequency detector as a first input.

In some embodiments, the apparatus further includes a second divider to divide a frequency of the feedback clock signal by 2, the divided feedback clock signal to be provided to the phase frequency detector as a second input.

In some embodiments, the apparatus further includes a delay element coupled with the first divider and with the first and second memory elements, the delay element to delay the divided reference clock signal by a certain time, the first memory element receiving a signal sampled on a first edge of the delayed divided reference clock signal and second memory element receives a signal sampled on a second edge of the delayed divided reference clock signal.

In some embodiments, the first memory element is a first flip-flop element and the second memory element is a second flip-flop element, wherein a clock input of the second flip-flop element is inverted from a clock input of the first flip-flop element.

In some embodiments, the phase detector to detect whether the reference clock signal or the feedback clock signal is leading in phase is a bang-bang phase detector (BBPD).

In some embodiments, the calibration mechanism is to calibrate the first charge pump and the second charge pump separately and simultaneously.

In some embodiments, the first control logic includes a first accumulator to accumulate values from the first memory element and the second control logic includes a second accumulator to accumulate values from the second memory element.

In some embodiments, a first accumulated output of the first accumulator is provided to a first shifter and a second accumulated output of the second accumulator is provided to a second shifter.

In some embodiments, a first shifted output of the first shifter is provided to a first digital-to-analog converter to generate a first control value for the integral path and a second shifted output of the second shifter is provided to a second digital-to-analog converter to generate a second control value for the proportional path.

In some embodiments, a method includes receiving a reference clock signal at a dual-path phased-lock loop having an integral path and a proportional path, the phased-lock loop generating a feedback clock signal; comparing phases of the reference clock signal and the feedback clock signal with a phase detector and generating data indicating which clock signal is leading or lagging; storing sampled data from the phase detector in a first memory element and a second memory element; adjusting current for a first charge pump of the integral path based on the sampled value stored in the first memory element; and adjusting current for a second charge pump of the proportional path based on the value stored in the second memory element.

In some embodiments, the method further includes dividing a frequency of the reference clock signal by 2 and providing the divided reference clock signal to a phase frequency detector as a first input.

In some embodiments, the method further includes dividing a frequency of the feedback clock signal by 2 and providing the divided feedback clock signal the phase frequency detector as a second input.

In some embodiments, the method further includes delaying the divided reference clock signal by a delay time; and sampling an output of the phase detector on both a first edge and a second edge of the delayed divided reference clock signal.

In some embodiments, the first memory element receives data sampled on the first edge of the delayed divided reference clock signal and the second memory element receives a signal sampled on a second edge of the delayed divided reference clock signal.

In some embodiments, the adjustment of the current for the first charge pump and the adjustment of the current for the second charge pump are performed separately and simultaneously.

In some embodiments, the method further includes accumulating values from the first memory element to generate a first accumulated output and the accumulating values from the second memory element to generate a second accumulated output.

In some embodiments, the method further includes shifting the first accumulated output to generate a first shifted output and shifting the second accumulated output to generate a second shifted output.

In some embodiments, the method further includes converting the first shifted output from a digital value to an analog first control value for the integral path and converting the second shifted output from a digital value to an analog second control value for the proportional path.

In some embodiments, a calibration mechanism for a phased-lock loop circuit includes a phase detector to detect whether a reference clock signal or a feedback clock signal is leading or lagging in phase and to generate a signal indicating which clock signal is leading or lagging, the feedback clock signal being generated by the phased-lock loop circuit; a first memory element and a second memory element to store the signal from the phase detector; a first control logic to adjust current for a first charge pump of an integral path of the phased-lock loop based on the value stored in the first memory element; and a second control logic to adjust current for a second charge pump of a proportional path of the phased-lock loop based on the value stored in the second memory element.

In some embodiments, the calibration mechanism further includes a first divider to divide a frequency of the reference clock signal by 2, the divided reference clock signal to be provided to a phase frequency detector as a first input.

In some embodiments, the calibration mechanism further includes a second divider to divide a frequency of the feedback clock signal by 2, the divided feedback clock signal to be provided to the phase frequency detector as a second input.

In some embodiments, the calibration mechanism further includes a delay element coupled with the first divider and with the first and second memory elements, the delay element to delay the divided reference clock signal by a certain time, the first memory element receiving a signal sampled on a first edge of the delayed divided reference clock signal and the second memory element receives a signal sampled on a second edge of the delayed divided reference clock signal.

In some embodiments, the calibration mechanism is to calibrate the first charge pump and the second charge pump separately and simultaneously.

In some embodiments, a non-transitory computer-readable storage medium having stored thereon data representing sequences of instructions that, when executed by a processor, cause the processor to perform operations including: receiving a reference clock signal at a dual-path phased-lock loop having an integral path and a proportional path, the phased-lock loop generating a feedback clock signal; comparing phases of the reference clock signal and the feedback clock signal with a phase detector and generating data indicating which clock signal is leading or lagging; storing sampled data from the phase detector in a first memory element and a second memory element; adjusting current for a first charge pump of the integral path based on the sampled value stored in the first memory element; and adjusting current for a second charge pump of the proportional path based on the value stored in the second memory element.

In some embodiments, the medium further includes instructions for dividing a frequency of the reference clock signal by 2 and providing the divided reference clock signal to a phase frequency detector as a first input.

In some embodiments, the medium further includes instructions for dividing a frequency of the feedback clock signal by 2 and providing the divided feedback clock signal to the phase frequency detector as a second input.

In some embodiments, the medium further includes instructions for delaying the divided reference clock signal by a delay time; and sampling an output of the phase detector on both a first edge and a second edge of the delayed divided reference clock signal.

In some embodiments, the first memory element receives data sampled on the first edge of the delayed divided reference clock signal and the second memory element receives a signal sampled on a second edge of the delayed divided reference clock signal.

In some embodiments, the adjustment of the current for the first charge pump and the adjustment of the current for the second charge pump are performed separately and simultaneously.

In some embodiments, the medium further includes instructions for accumulating values from the first memory element to generate a first accumulated output and the accumulating values from the second memory element to generate a second accumulated output.

In some embodiments, the medium further includes instructions for shifting the first accumulated output to generate a first shifted output and shifting the second accumulated output to generate a second shifted output.

In some embodiments, the medium further includes instructions for converting the first shifted output from a digital value to an analog first control value for the integral path and converting the second shifted output from a digital value to an analog second control value for the proportional path.

In some embodiments, an apparatus includes: a means for receiving a reference clock signal at a dual-path phased-lock loop having an integral path and a proportional path, the phased-lock loop generating a feedback clock signal; a means for comparing phases of the reference clock signal and the feedback clock signal with a phase detector and generating data indicating which clock signal is leading or lagging; storing sampled data from the phase detector in a first memory element and a second memory element; a means for adjusting current for a first charge pump of the integral path based on the sampled value stored in the first memory element; and a means for adjusting current for a second charge pump of the proportional path based on the value stored in the second memory element.

In some embodiments, the apparatus further includes a means for dividing a frequency of the reference clock signal by 2 and providing the divided reference clock signal to a phase frequency detector as a first input.

In some embodiments, the apparatus further includes a means for dividing a frequency of the feedback clock signal by 2 and providing the divided feedback clock signal to the phase frequency detector as a second input.

In some embodiments, the apparatus further includes a means for delaying the divided reference clock signal by a delay time; and sampling an output of the phase detector on both a first edge and a second edge of the delayed divided reference clock signal.

In some embodiments, the first memory element receives data sampled on the first edge of the delayed divided reference clock signal and the second memory element receives a signal sampled on a second edge of the delayed divided reference clock signal.

In some embodiments, the adjustment of the current for the first charge pump and the adjustment of the current for the second charge pump are performed separately and simultaneously.

In some embodiments, the apparatus further includes a means for accumulating values from the first memory element to generate a first accumulated output and the accumulating values from the second memory element to generate a second accumulated output.

In some embodiments, the apparatus further includes a means for shifting the first accumulated output to generate a first shifted output and shifting the second accumulated output to generate a second shifted output.

In some embodiments, the apparatus further includes a means for converting the first shifted output from a digital value to an analog first control value for the integral path and converting the second shifted output from a digital value to an analog second control value for the proportional path.

What is claimed is:

1. An apparatus comprising:
   a phase frequency detector;
   an integral path including a first charge pump;
   a proportional path including a second charge pump; and
   a calibration mechanism for the first charge pump and the second charge pump including:
   a phase detector to detect whether a reference clock signal or a feedback clock signal is leading or lagging in phase and to generate a signal indicating which clock signal is leading or lagging,
   a first memory element and a second memory element to store the signal from the phase detector,
   a first control logic to adjust current for the first charge pump based on the value stored in the first memory element, and
   a second control logic to adjust current for the second charge pump based on the value stored in the second memory element.

2. The apparatus of claim 1, further comprising a first divider to divide a frequency of the reference clock signal by 2, the divided reference clock signal to be provided to the phase frequency detector as a first input.

3. The apparatus of claim 2, further comprising a second divider to divide a frequency of the feedback clock signal by 2, the divided feedback clock signal to be provided to the phase frequency detector as a second input.

4. The apparatus of claim 2, further comprising a delay element coupled with the first divider and with the first and second memory elements, the delay element to delay the divided reference clock signal by a certain time, the first memory element receiving a signal sampled on a first edge of the delayed divided reference clock signal and the second memory element receives a signal sampled on a second edge of the delayed divided reference clock signal.

5. The apparatus of claim 4, wherein the first memory element is a first flip-flop element and the second memory element is a second flip-flop element, wherein a clock input of the second flip-flop element is inverted from a clock input of the first flip-flop element.

6. The apparatus of claim 1, wherein the phase detector to detect whether the reference clock signal or the feedback clock signal is leading in phase is a bang-bang phase detector (BBPD).

7. The apparatus of claim 1, wherein the calibration mechanism is to calibrate the first charge pump and the second charge pump separately and simultaneously.

8. The apparatus of claim 1, wherein the first control logic includes a first accumulator to accumulate values from the first memory element and the second control logic includes a second accumulator to accumulate values from the second memory element.

9. The apparatus of claim 8, wherein a first accumulated output of the first accumulator is provided to a first shifter and a second accumulated output of the second accumulator is provided to a second shifter.

10. The apparatus of claim 9, wherein a first shifted output of the first shifter is provided to a first digital-to-analog converter to generate a first control value for the integral path and a second shifted output of the second shifter is provided to a second digital-to-analog converter to generate a second control value for the proportional path.

11. A method comprising:
    receiving a reference clock signal at a dual-path phased-lock loop having an integral path and a proportional path, the phased-lock loop generating a feedback clock signal; and
    performing calibration for a first charge pump in the integral path and a second charge pump in the proportional path by:
    comparing phases of the reference clock signal and the feedback clock signal with a phase detector and generating data indicating which clock signal is leading or lagging,
    storing sampled data from the phase detector in a first memory element and a second memory element, adjusting current for the first charge pump of the integral path based on the sampled value stored in the first memory element, and adjusting current for the second charge pump of the proportional path based on the value stored in the second memory element.

12. The method of claim 11, further comprising dividing a frequency of the reference clock signal by 2 and providing the divided reference clock signal to a phase frequency detector as a first input.

13. The method of claim 12, further comprising dividing a frequency of the feedback clock signal by 2 and providing the divided feedback clock signal to the phase frequency detector as a second input.

14. The method of claim 12, further comprising:
delaying the divided reference clock signal by a delay time; and
sampling an output of the phase detector on both a first edge and a second edge of the delayed divided reference clock signal.

15. The method of claim 14, wherein the first memory element receives data sampled on the first edge of the delayed divided reference clock signal and the second memory element receives a signal sampled on a second edge of the delayed divided reference clock signal.

16. The method of claim 11, wherein the adjustment of the current for the first charge pump and the adjustment of the current for the second charge pump are performed separately and simultaneously.

17. The method of claim 11, further comprising accumulating values from the first memory element to generate a first accumulated output and the accumulating values from the second memory element to generate a second accumulated output.

18. The method of claim 17, further comprising shifting the first accumulated output to generate a first shifted output and shifting the second accumulated output to generate a second shifted output.

19. The method of claim 18, further comprising converting the first shifted output from a digital value to an analog first control value for the integral path and converting the second shifted output from a digital value to an analog second control value for the proportional path.

20. A calibration mechanism for a phased-lock loop circuit comprising:
a phase detector to detect whether a reference clock signal or a feedback clock signal is leading or lagging in phase and to generate a signal indicating which clock signal is leading or lagging, the feedback clock signal being generated by the phased-lock loop circuit;
a first memory element and a second memory element to store the signal from the phase detector;
a first control logic to adjust current for a first charge pump of an integral path of the phased-lock loop based on the value stored in the first memory element; and
a second control logic to adjust current for a second charge pump of a proportional path of the phased-lock loop based on the value stored in the second memory element.

21. The calibration mechanism of claim 20, further comprising a first divider to divide a frequency of the reference clock signal by 2, the divided reference clock signal to be provided to a phase frequency detector as a first input.

22. The calibration mechanism of claim 21, further comprising a second divider to divide a frequency of the feedback clock signal by 2, the divided feedback clock signal to be provided to the phase frequency detector as a second input.

23. The calibration mechanism of claim 22, further comprising a delay element coupled with the first divider and the first and second memory elements, the delay element to delay the divided reference clock signal by a certain time, the first memory element receiving a signal sampled on a first edge of the delayed divided reference clock signal and second memory receives a signal sampled on a second edge of the delayed divided reference clock signal.

24. The calibration mechanism of claim 20, wherein the calibration mechanism is to calibrate the first charge pump and the second charge pump separately and simultaneously.

\* \* \* \* \*